Oct. 30, 1962 G. COHEN ET AL 3,060,656

MANUFACTURE OF HERMETICALLY SEALED SEMICONDUCTOR DEVICE

Original Filed June 23, 1958

INVENTORS.
GENE COHEN and
FRANK H. TOBIN
BY Elmer J. Nealon
ATTORNEY.

United States Patent Office 3,060,656

Patented Oct. 30, 1962

3,060,656

MANUFACTURE OF HERMETICALLY SEALED SEMICONDUCTOR DEVICE

Gene Cohen, Arlington, and Frank H. Tobin, Lexington, Mass., assignors, by mesne assignments, to Sylvania Electric Products, Inc., Wilmington, Del., a corporation of Delaware Original application June 23, 1958, Ser. No. 743,724, now Patent No. 2,960,641, dated Nov. 15, 1960. Divided and this application Mar. 7, 1960, Ser. No. 15,786

4 Claims. (Cl. 53—37)

Figure 1:
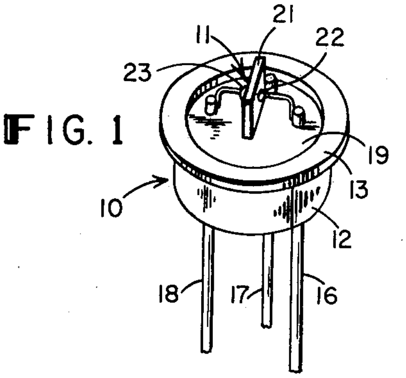

This invention relates to electrical translating devices. More particularly, it is concerned with semiconductor devices having air-tight enclosures and to methods of sealing such enclosures while protecting the active elements from any adverse effects of the sealing operation. This application is a division of application Serial No. 743,724, filed June 23, 1958, now Patent No. 2,960,641 granted November 15, 1960, for Hermetically Sealed Semiconductor Device and Manufacture Thereof.

It has become common practice in the semiconductor art to provide various safeguards in order to protect the sensitive active semiconductor elements from all possible forms of contamination. In the device itself protection generally is obtained by surrounding the active elements with a so-called encapsulating material and by packaging the encapsulated active elements in an air-tight enclosure. The encapsulating material may be any of various combinations of substances which are inert to the active semiconductor elements and are impervious to contaminants which would react harmfully with the semiconductor surfaces.

One form of enclosure or housing commonly employed for silicon and germanium transistors of well known types consists of a bi-part container having a base or stem and a cover. The base section includes a dished casing of metal having a layer of glass sealed therein. Electrode contacting leads extend through the bottom of the casing and are insulated therefrom by the glass layer through which they are sealed. The active elements of the device are in electrical contact with and supported by the leads. The cover section is a cup-shaped cap of metal adapted to fit over and protect the active elements. The cover and base have mating surfaces of metal which are sealed together as by welding. Certain enclosures of this general type have become standardized for transistor packages and are in wide use throughout the industry.

Containers of the aforementioned type provide some of the benefits of standardization to the industry, but they also contribute some problems in the production of transistors. Welding or otherwise fusing the cover to the stem section produces gases and metallic particles which are detrimental to the active elements. Although encapsulating material surrounds the active elements, it is possible for contaminants from the weld flash to reach the elements or to penetrate sufficiently close to cause adverse effects immediately or at some time subsequent to sealing.

The application of the encapsulating material to the active elements presents some difficulties in itself. The material must be placed at the proper location and in the correct amount in order to give maximum protection to the device. If insufficient encapsulating material is applied, portions of the active elements may be directly exposed to the weld flash or have inadequate protection from it. If an excess of encapsulating material is applied, it may spread to the sealing surfaces of the container thus preventing a satisfactory seal from being obtained. A slight error in locating the encapsulating material may similarly contaminate the sealing surfaces. Other problems may be encountered depending on the encapsulating material employed. For example, it may be necessary to permit the encapsulating material to cure or set, or the encapsulating material may be applied in the liquid state.

It is an object of our invention to provide an improved method of sealing a semiconductor device while protecting the active elements of the device.

It is also an object of our invention to provide an improved semiconductor device having an envelope structure amenable to simplified assembly techniques and hermetic sealing without adverse effects on the enclosed active elements.

Briefly, in fulfilling the objects of our invention a capsule or cup adapted to fit within the air-tight enclosure of the device is filled with encapsulating material. The base section of a bi-part container having the active elements mounted thereon is joined to the filled capsule with the active elements surrounded by the encapsulating material and a portion of the capsule interposed between the active elements and the portion of the base section adapted for sealing to a cover section. A cover section is placed in position over the capsule and in contact with the portion of the base section adapted for sealing to the cover section. The base and cover sections are then sealed together to form a hermetically sealed enclosure.

Figure 2:
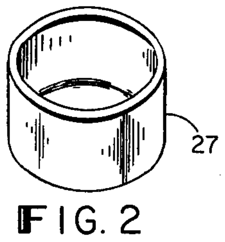
Figure 3:
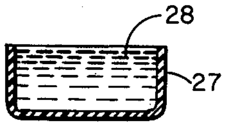
Figures 4, 5:
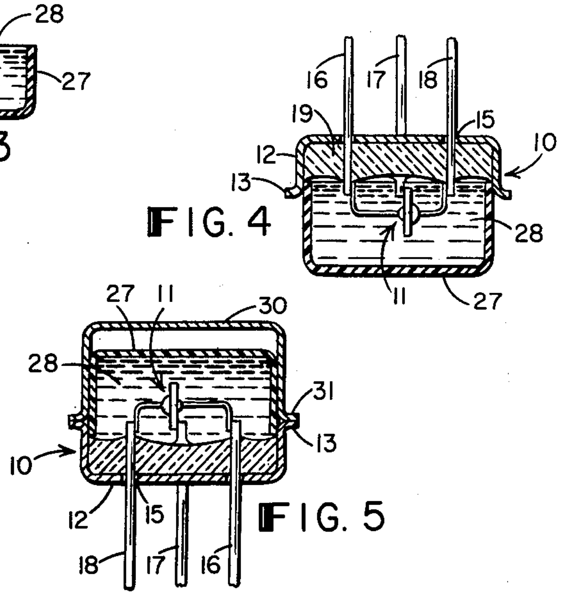

A clear understanding of the invention and its advantages together with additional objects and features thereof may be obtained from the following detailed description and the accompanying drawings wherein:

FIG. 1 is a perspective view of the base or stem section of a bi-part container employed in the practice of our invention showing the active elements of a semiconductor transistor mounted thereon, FIG. 2 is a perspective view of a capsule employed in the practice of our invention, FIG. 3 is an elevational view in cross-section of the capsule of FIG. 2 filled with an encapsulating material, FIG. 4 is an elevational view partially in cross-section of the base section of FIG. 1 joined with the filled capsule of FIG. 3, FIG. 5 is an elevational view partially in cross-section of a completed transistor showing the cover section of the container sealed in position to the base section of the sub-assembly of FIG. 4.

In FIG. 1 is shown the base section 10 of a cylindrical bi-part semiconductor device package or container of well known type having the active elements 11 of an alloyed junction transistor mounted thereon. This standard base or stem includes a metal casing 12 having at its periphery an outwardly turned upper rim 13 adapted for sealing to the cover section of the container or enclosure. Three leads 16, 17, and 18 pass through openings 15, best shown in FIG. 4, in the bottom of the casing. The leads are hermetically sealed in position by a layer or filler of glass 19 which is also hermetically sealed to the casing 12. The upper surface of the glass layer is located slightly below the rim of the casing. The active elements of the alloyed junction transistor consisting of a slab of semiconductor material 21, an emitter dot 22, and a collector dot 23 are electrically connected to the base lead 17, the emitter lead 16, and the collector lead 18 respectively. These leads serve not only as the electrical connections to the active elements but also as the means by which the active elements are mounted on the base.

A cup-shaped capsule or receptacle 27 of a material which is inert to the encapsulating material employed and which will not contaminate the active elements of the transistor is shown in FIG. 2. It is also desirable that the capsule be nonconductive in order to eliminate inadvertent shorting of the electrodes or leads of the device.

The outside diameter of the cylindrical capsule is such that the capsule will fit closely within the inside of the casing 12 of the base section. The inner diameter and height of the capsule are chosen so that the capsule will fit over the base section with adequate clearance for the active elements 11.

The capsule is filled with a suitable encapsulating material 28 as shown in FIG. 3. The material may be any of various substances used in the art to protect the active semiconductor elements from the surrounding medium. For example, potting compounds and stabilizing casting resins of various compositions as well as silicone and fluorocarbon greases are widely used in semiconductor devices for this purpose depending upon the desires of the individual practitioner. An accurate measure of the quantity of encapsulating material employed is provided by the filled capsule.

The base section 10 and the appropriately prepared active elements 11 are joined with the filled capsule in the manner shown in FIG. 4. The base section is placed over the capsule with the active elements tending downward. The outer diameter of the capsule fits snugly within the casing 12, and the bottom edge of the capsule butts against the surface of the glass layer 19. The active elements 11 are thus shielded from all portions of the rim 13 of the base section by the interposed walls of the capsule lying between the rim and the active elements, and are completely immersed in and surrounded by the encapsulating material 28.

The subassembly as shown in FIG. 4 may then be processed as desired. If heat treating is required for setting or curing the encapsulating material, this step may be carried out at this stage in the process. With the encapsulating material and capsule in position as shown, the base and capsule enclose the active elements and the encapsulating material. The sensitive active elements of the transistor thus are effectively protected from contaminants in the atmosphere. The subassembly may then be stored or moved about with no harm to the device as long as the capsule and encapsulating material are not disturbed.

In the final assembly of the device, a standard metal cover section 30 of the bi-part package is sealed in position as shown in FIG. 5. The cover fits snugly over the cylindrical walls of the capsule 27 and has an outwardly turned rim 31 which mates with the rim 13 of the casing 12 of the stem. The rims of the cover and casing contact each other at surfaces adapted for sealing and are welded together forming a hermetic seal about the entire enclosure. During the welding operation hot particles and vapors from the weld are blocked from attacking the encapsulating material adjacent the active elements. The walls of the capsule extend across the joint between the cover and the casing and shield the active elements from the adverse effects of forming the seal.

In one embodiment of our invention employing a standard container of the type herein described, we have utilized a capsule or cup of plastic of the polymerized fluorinated ethylene type sold under the trade name of Teflon. The encapsulating material was a thixotropic or viscous material consisting of an intimate mixture of:

2 parts by volume of a fluorinated organic compound sold under the trade-name FC–43 by Minnesota Mining and Manufacturing Co., 4 parts by volume of silica sold under the trade-name Cab-O-Sil by Godfrey L. Cabot, Inc., and 1 part by volume of a calcium alumino silicate desiccant sold under the trade-name Type 5A Molecular Sieve by Linde Air Products Company.

After the capsule filled with the above encapsulating material and the base section were united as shown in FIG. 4, the resulting subassembly tended to hold tightly together and was placed aside to await final assembly. The cover subsequently was welded in position to form the completed device.

We claim:

1. The method of sealing the active elements of an electrical translating device within a container having a base section with the active elements mounted thereon and a cover section, including the steps of placing an encapsulating material in a receptacle, joining the receptacle and the base section of the container with the active elements surrounded by encapsulating material and a portion of the receptacle interposed between the active elements and the portion of the base section adapted for sealing to the cover section, placing the cover section on the base section in contact with said portion of the base section adapted for sealing to the cover section, and sealing said cover section to said base section.

2. The method of sealing the active elements of an electrical translating device within a bi-part container, including the steps of filling a capsule with an encapsulating material, uniting the filled capsule and one part of the bi-part container having the active elements mounted thereon with the encapsulating material surrounding the active elements and with a portion of the capsule lying between the active elements and the periphery of said one part, placing the other part of said container in contact with the periphery of said first part, and sealing said parts together.

3. The method of hermetically sealing the active elements of an electrical translating device within a bi-part container having a base section with the active elements mounted thereon and a cover section, including the steps of filling a capsule of inert material adapted to fit within said container with an encapsulating material, joining the filled capsule and the base section of the container with the capsule and base section enclosing the active elements and encapsulating material and with the active elements immersed in encapsulating material, the walls of said capsule lying between the active elements and the portion of the base section adapted for sealing to the cover section, placing the cover section on the base section in contact with said portion of the base section adapted for sealing to the cover section, and welding said cover section to said base section to form a hermetic seal therebetween.

4. The method of hermetically sealing the active elements of a semiconductor transistor within a bi-part enclosure having a base section and a cover section, each of said sections having a rim adapted for sealing to the rim of the other of said sections, said base section having the active elements mounted thereon, said method including the steps of filling a plastic capsule adapted to fit within said enclosure with an inert thixotropic encapsulating material, uniting the filled capsule and the base section of said enclosure with the capsule of the base section enclosing the active elements and encapsulating material and with the active elements immersed in encapsulating material, the walls of said capsule being interposed between the active elements and the rim of the base section, joining the cover section and the base section with the rim of the cover section contacting the rim of the base section, and welding said rims together to form a hermetic seal therebetween, thereby forming an air-tight enclosure surrounding the encapsulated active elements.

References Cited in the file of this patent

UNITED STATES PATENTS

| | | |
|---|---|---|
| 2,546,321 | Ruggles | Mar. 27, 1951 |
| 2,716,722 | Rothstein | Aug. 30, 1955 |
| 2,788,474 | Jackson | Apr. 9, 1957 |
| 2,810,870 | Hunter et al. | Oct. 22, 1957 |
| 2,815,152 | Mills | Dec. 3, 1957 |
| 2,825,014 | Willemse | Feb. 25, 1958 |
| 2,889,078 | Thomas | June 2, 1959 |
| 2,928,030 | Lighty | Mar. 8, 1960 |